(12) United States Patent
Raychaudhuri et al.

(10) Patent No.: US 7,157,156 B2
(45) Date of Patent: Jan. 2, 2007

(54) ORGANIC LIGHT EMITTING DEVICE HAVING IMPROVED STABILITY

(75) Inventors: Pranab K. Raychaudhuri, Rochester, NY (US); Joseph K. Madathil, Rochester, NY (US); Liang-Sheng Liao, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 350 days.

(21) Appl. No.: 10/804,960

(22) Filed: Mar. 19, 2004

(65) Prior Publication Data
US 2005/0208330 A1 Sep. 22, 2005

(51) Int. Cl.
H05B 33/26 (2006.01)
H01L 51/50 (2006.01)

(52) U.S. Cl. .................. 428/690; 428/212; 428/332; 428/917; 313/504; 313/506; 313/503; 257/98

(58) Field of Classification Search ........... 428/212, 428/332, 690, 917; 313/504, 506, 503, 113; 257/98

See application file for complete search history.

(56) References Cited

U.S. PATENT DOCUMENTS

| | | | |
|---|---|---|---|
| 4,356,429 A * | 10/1982 | Tang | .................. 313/503 |
| 4,769,292 A | 9/1988 | Tange et al. | |
| 4,885,211 A | 12/1989 | Tang et al. | |
| 5,645,948 A | 7/1997 | Shi et al. | |
| 6,020,078 A | 2/2000 | Chen et al. | |
| 6,226,890 B1 | 5/2001 | Boroson et al. | |
| 6,366,017 B1 | 4/2002 | Antoniadis et al. | |
| 2002/0117962 A1 | 8/2002 | Beierlein et al. | |
| 2003/0234608 A1* | 12/2003 | Lee et al. | .................. 313/504 |
| 2004/0021414 A1 | 2/2004 | Hanawa et al. | |

FOREIGN PATENT DOCUMENTS

| | | |
|---|---|---|
| EP | 1076368 | 2/2001 |
| EP | 1244153 | 9/2002 |
| WO | 03/055275 | 7/2003 |

OTHER PUBLICATIONS

"High-efficiency top-emittig organic light-emitting devices" by M. H. Lu et al., Applied Physics Letters, vol. 81, No. 21, Nov. 18, 2002, pp. 3921-3923.
"Phosphorescent top-emitting organic light-emitting devices with improved light outcoupling" by H Riel, et al., Applied Physics Letters, vol. 82, No. 3, Jan. 20, 2003, pp. 466-468.
1.3: Performance Enhancement of Top- and Bottom-Emitting Organic Light-emitting devices using microcavity structures, by P. K. Raychaudhuri, et al., Proceeding of the The 23$^{rd}$ International Display Research Conference, Phoenix, AZ, USA, Sep. 15-19, 2003, p. 10.
"Metal oxides as a hole-injecting layer for an organic electroluminescent device" by Shizuo Tokito et al., J. Phys. D: Appl. Phys. (1996) 2750-2753.

(Continued)

Primary Examiner—Dawn L. Garrett
(74) Attorney, Agent, or Firm—Raymond L. Owens

(57) ABSTRACT

In an OLED device, the improvement including a reflective and conductive bilayer anode including a metal or metal alloy or both; a hole-injecting structure over the reflective and conductive bilayer anode; at least one organic layer formed over the hole-injecting structure; and the reflective and conductive bilayer anode being configured to improve the stability of drive voltage.

21 Claims, 6 Drawing Sheets

OTHER PUBLICATIONS

"Fabrication of Lithium-Based Alloy Cathodes for Organic Light-Emitting Diodes" by D C Magnetron Sputtering, by P. K. Raychaudhuri et al., SID 2001 International Symposium (Jun. 5-7, San Jose, California) Digest, paper 31.4; vol. 32, pp. 526-529, 2001.
"Fabrication of sputtered cathode for organic light-emitting diodes (OLED) using transparent buffer", by P. K. Raychaudhuri et al., Proceedings of the 7th Asian Symposium on Information Display (Sep. 2-4, Singapore) Digest, paper 50; vol. 32, pp. 55-58, 2002.

"Orgaic electroluminescent devices with improved stability" by S. A. VanSlyke, et al., Appl. Phys. Letter 69 (15) Oct. 7, 1996, pp. 2160-2162.
Takada et al, "Control of emission characteristics in organic thin-film electroluminescent diodes using an optical-microcavity structure", Appl. Phys. Lett. 63(15) Oct. 11, 1993, pp. 2032-2034.

* cited by examiner

ORGANIC LIGHT EMITTING DEVICE HAVING IMPROVED STABILITY

CROSS-REFERENCE TO RELATED APPLICATIONS

Reference is made to commonly assigned U.S. patent application Ser. No. 10/347,013, filed Jan. 17, 2003, entitled "Organic Light Emitting Device (OLED) Display With Improved Light Emission Using a Metallic Anode" by Pranab K. Raychaudhuri et al.

FIELD OF THE INVENTION

The present invention relates to top- and bottom-emitting organic light emitting diodes (OLEDs), which use metallic electrodes and with improved stability in drive voltage which exhibit stable operational voltage in long-term use.

BACKGROUND OF THE INVENTION

An organic electroluminescent (OEL) device, alternately known as organic light emitting diode (OLED), is useful in flat-panel display applications. This light-emissive device is attractive because it can be designed to produce red, green, and blue colors with high luminance efficiency; it is operable with a low driving voltage of the order of a few volts and clearly viewable from oblique angles. These unique attributes are derived from a basic OLED structure comprising of a multilayer stack of thin films of small-molecule organic materials sandwiched between an anode and a cathode. Tang et al in commonly-assigned U.S. Pat. Nos. 4,769,292 and 4,885,211 have disclosed such a structure. The common electroluminescent (EL) medium is comprised of a bilayer structure of a hole-transport (HTL) layer and an electron-transport layer (ETL), typically of the order of a few tens of nanometer (nm) thick for each layer. When an electrical potential difference is applied at the electrodes, the injected carriers—hole at the anode and electron at the cathode—migrate towards each other through the EL medium and a fraction of them recombines in the emitting layer (ETL) a region close to the HTL/ETL interface, to emit light. The intensity of electroluminescence is dependent on the EL medium, drive voltage, and charge injecting nature of the electrodes. The light viewable outside of the device is further dependent on the design of the organic stack and optical properties of the substrate, anode and the cathode.

Conventional OLEDs are bottom emitting (BE), meaning that the display is viewed through the substrate that supports the OLED structure. The devices normally employ glass substrates having a layer of highly transparent indium-tin-oxide (ITO) layer that also serves as the anode. The cathode is typically a reflective thin film of MgAg although lithium-containing alloys are also used as an efficient electron injecting electrode. The light generated within the device is emitted in all directions. However, only a small fraction of generated light is available for viewing, and about 80% of generated light is trapped within the device in waveguiding modes in glass, ITO and organic layers. The light emitted toward the anode at less than the critical angle passes through the anode and the substrate to the viewer, and the light emitted in the opposite direction is reflected at the cathode and passes through the substrate, enhancing the viewing intensity. A high-transparency substrate and anode and a high-reflectivity cathode are thus preferred.

The OLED display is typically coupled with active matrix (AM) circuitry in order to produce high performance displays. For the AM bottom emitting display, which uses switching elements of thin film transistors, the transistors are fabricated on glass substrates. Consequently the open area available for the light to emerge is reduced. With the application of multi-transistor and complex circuitry in the backplane the open area through which the light emerges is reduced. The ratio of the open area to that of the entire display area is called the aperture ratio. Due to the reduction of the aperture ratio the display will run dim. To compensate for the reduced average brightness level, the drive current has to be increased subjecting the display to increased risk of operational degradation. It follows that more complex pixel drive circuitry cannot be readily implemented without further compromising aperture ratio and operation stability.

To alleviate this problem the emitted light can be made to emerge through top surface. In the top-emitting design the drive circuitry is fabricated on substrate and the light emits from the opposite surface. This design permits the use of complex circuitry occupying whatever substrate space is needed and the aperture ratio is not affected. The high aperture ratio makes the display viewable consuming less power. The devices have the prospect of running at low drive current while maintaining readability and thus extending the operational life.

The devices employing opaque backplanes such as silicon the OLED must be of the top-emitting type. The top surface, usually the cathode, needs to be at least semitransparent in order to allow the light to exit through the top. The device should preferably include a reflector or a reflecting anode opposite to the cathode side to redirect the light emitting toward the anode.

Any device design top- or bottom-emitting should be aimed at achieving highest possible efficiency. However, realizing high efficiency by reclaiming light lost to waveguiding modes can be very difficult. To recover even a fraction of light lost to waveguiding modes the device architecture can be very complex.

An approach to enhance the efficiency without introducing such complexity is to implement the microcavity design of the structure of the device which includes reflecting electrodes. Sony Corporation (EP 1 154 676 A1) has disclosed an anode made of light-reflecting materials such as Pt, Au, Cr, W, or presumably other high-work function materials in conjunction with an optional buffer/hole-injecting layer (HIL). Sony also reported (EP 1 102 317 A2) an anode composed of a transparent conducting film such as ITO formed on the reflecting layer. The top electrode was a semitransparent reflecting layer of MgAg or Al:Li alloy serving as the cathode through which the light emerges. Lu et al. reported top-emitting, highly efficient OLEDs that used reflective metals in the anode structure, a phosphorescent emissive layer, $Ir(ppy)_3$, and a semitransparent compound cathode. ("High-efficiency top-emitting organic light-emitting devices", M.-H. Lu, M. S. Weaver, T. X. Zhou, M. Rothman, R. C. Kwong, M. Hack, and J. J. Brown, Appl. Phys. Lett. 81, 3921 (2002)). Riel et al. demonstrated ("Phosphorescent top-emitting organic light-emitting devices with improved light outcoupling", H. Riel, S. Karg, T. Beierlein, B. Rushtaller, and W. Rieb, Appl. Phys. Lett. 82, 466 (2003) high-efficiency top emitter, also using the $Ir(ppy)_3$ emissive layer, high work-function metal anodes, and semitransparent cathodes and further employing a ZnSe layer over the semitransparent compound cathode for improved light outcoupling. These top-emitters demonstrated efficiencies that are higher than the equivalent bottom-emitting non-microcavity devices. Raychaudhuri et.al. reported top- and bottom-emitting microcavity devices that are twice as efficient as the optimized bottom-emitting non-microcavity device ("Performance enhancement of bottom-and top-emitting organic light-emitting devices using microcavity structures", P. K. Raychaudhuri*, J. K. Madathil, Joel D. Shore and Steven A. Van Slyke, Proceedings of the 23 rd International Display Research Conference, Phoenix, Ariz., Sep. 16 to 18, 2003 p 10).

By employing highly reflective electrodes it is possible to remarkably increase the out coupling of generated light. In the microcavity device the light emitted out of the cavity depends on the cavity design. The resonance wavelength of a microcavity is given by $$2\Sigma(n_i d_i)/\lambda - (\Phi_1 + \Phi_2)/360° = m,$$

where $m=0, 1, 2, \ldots$, $\lambda$ is the peak wavelength of the light emerging out of the cavity consisting of layers having the thickness $d_i$ and refractive index $n_i$, and $\Phi_1$ and $\Phi_2$ are the phase shifts of light in degrees upon reflection from the two reflecting electrodes. The quantity $n_i d_i$ is conventionally called the "optical path length" in the material, so $\Sigma(n_i d_i)$ is the total optical path length in the microcavity. For a fixed optical path length of the microcavity, the strength of this emission (and to a much lesser degree its wavelength) is also influenced by the location of the emission zone within the cavity. If a reasonable distance between the cathode and HTL/ETL interface is selected, we can then vary the HTL thickness in order to vary the optical path length of the microcavity. The maximum luminance occurs for an HTL thickness such that the resonance wavelength of the microcavity is well-aligned with the peak in the innate emission spectrum of the particular dopant-host material. The first maximum occurs at the HTL thickness corresponding to $m=0$, and subsequent maxima occur at the HTL thickness corresponding to $m=1, 2$ and so on.

FIG. 1 is a plot of luminance of a top-emitting microcavity structure as a function of NPB HTL thickness up to the thickness corresponding to $m=1$ as determined by optical modeling. The structure of the OLED is: Glass/80 nm Ag NPB (variable)/60 nm Alq/14 nm MgAg which includes the fully reflective Ag anode deposited on the glass substrate. The MgAg top electrode is the cathode, and being thin and semitransparent allows significant emission through the top surface of the OLED.

FIG. 1 shows that for this structure the first maximum of the luminance occurs at 46 nm and the second maximum occurs at 196 nm of NPB thickness. It is obvious that plots of the luminance as a function of NPB HTL thickness for the emission at other wavelengths will be similar to the FIG. 1 but the cavity length will be slightly different, and the maxima of resonance wavelengths will occur at slightly different NPB thicknesses. It has been found, however, that the OLED based on the above layer structure was inefficient. An interlayer between the Ag and NPB HTL was found useful in lowering the operating voltage and improving the stability of the OLED. The interlayer, which functions as the hole-injection and diffusion barrier, is very thin (1 to 2 nm thick) and highly transparent. Thus it does not significantly affect the optics of the OLED. The OLED structure with 46 nm NPB is most desirable for maximizing efficiency and minimizing the angular dependence of the color but the one with the 196 nm NPB can be desirable from a manufacturing point of view. This is because the thin NPB can yield shorted OLEDs that can catastrophically fail in use. On the other hand, thick NPB HTL is likely to increase the drive voltage.

FIG. 2 is a plot of luminance of a bottom-emitting microcavity structure as a function of NPB HTL thickness up to the thickness corresponding to $m=1$ as determined by optical modeling. The structure of the OLED is: Glass/20 nm Ag/NPB (variable)/60 nm Alq/200 nm MgAg which includes the reflective, semitransparent and conductive Ag anode deposited on the glass substrate. The MgAg top electrode is the reflective, opaque and conductive. The Ag anode being thin and semitransparent allows significant emission through substrate.

Further, FIG. 2 is very similar to FIG. 1 and shows that for this structure the first maximum of the luminance occurs at about 50 nm and the second maximum occurs at about 200 nm of NPB thickness. It is obvious that plots of the luminance as a function of NPB HTL thickness for the emission at other wavelengths will be similar to the FIG. 1 but the cavity length will be slightly different, and the maxima of resonance wavelengths will occur at slightly different NPB thicknesses. Here again, the OLED structure with 50 nm NPB is most desirable for maximizing efficiency and minimizing the angular dependence of the color but the one with the 200 nm NPB can be desirable from a manufacturing point of view and stability. In the bottom-emitting device a thin hole injecting layer (HIL) including a fluorinated carbon or an oxide, disposed between the Ag anode and the NPB HTL was found to reduce the drive voltage and improve the efficiency. The HIL is very thin (1 to 2 nm thick) and highly transparent, and does not significantly affect the optics of the OLED. The HIL can also act as a diffusion barrier and improve the stability of the diode.

In operation, OLEDs in general, degrade in performance characterized by loss of luminance with concurrent increase in drive voltage. This may indicate changes in the bulk of the active layer as well as degradation of injecting contacts of the diode. An active matrix OLED display is operated at constant current requiring continuous increase in drive voltage during operation to maintain the drive current. The provision is made in the drive circuits of the AM OLED backplane to provide the excess voltage on demand. This provision results in wasted power even if the excess voltage is never used. If a display device is made that would not require adjustment in drive voltage in operation, then the drive circuit can be designed with little or no voltage allowance. This would result in substantial saving in power consumption. Such devices are those with contacts that would not degrade in extended use.

SUMMARY OF THE INVENTION

It is therefore an object of the present invention to provide top and bottom emitting microcavity OLEDs operable with stable drive voltage in long-term application.

It is another object of the present invention is to achieve the objects without compromising the lifetime or significantly affecting the efficiency of the device.

It is yet another object of the present invention is to achieve the objects without introducing significant complexity in the process or without major alteration of the device structure.

These objects are achieved in an OLED device, the improvement comprising:

(a) a reflective and conductive bilayer anode including a metal or metal alloy or both;

(b) a hole-injecting structure over the reflective and conductive bilayer anode;

(c) at least one organic layer formed over the hole-injecting structure; and (d) the reflective and conductive bilayer anode being configured to improve the stability of drive voltage.

In accordance with the present invention it was found that the bilayer anode structure including a base layer and a skin layer results in OLEDs, which exhibit stable drive voltage. In contrast to prior art OLEDs including a single layer metallic anode, the OLEDs of the present invention needs very little or no such adjustment in drive voltage, whereas in order to maintain drive current throughout the operating life the prior art device requires monotonic increase in drive voltage. It has been further determined that high efficiency of top- or bottom emission can be achieved by selecting a high reflectivity metallic base layer and a thin semitransparent skin alloy layer in the anode structure.

DETAILED DESCRIPTION OF THE INVENTION

Throughout the ensuing description acronyms are used to designate the names of the different organic layers and operating features of organic light-emitting devices. For reference they are listed in Table 1:

TABLE 1

| | |
|---|---|
| OLED | Organic light-emitting diode |
| ITO | Indium tin oxide |
| HIL | Hole- injection Layer |
| HTL | Hole-transport layer |
| EML | Emissive layer |
| ETL | Electron-transport layer |
| TEL | Transmission-enhancement layer |
| NPB | 4,4'-Bis[N-(1-naphthyl)-N-phenylamino]biphenyl (NPB) |
| Alq | Tris(8-hydroxyquinoline) aluminum |
| MgAg | Mg(90 v %) Ag(10 v %) alloy |

Figure 3:
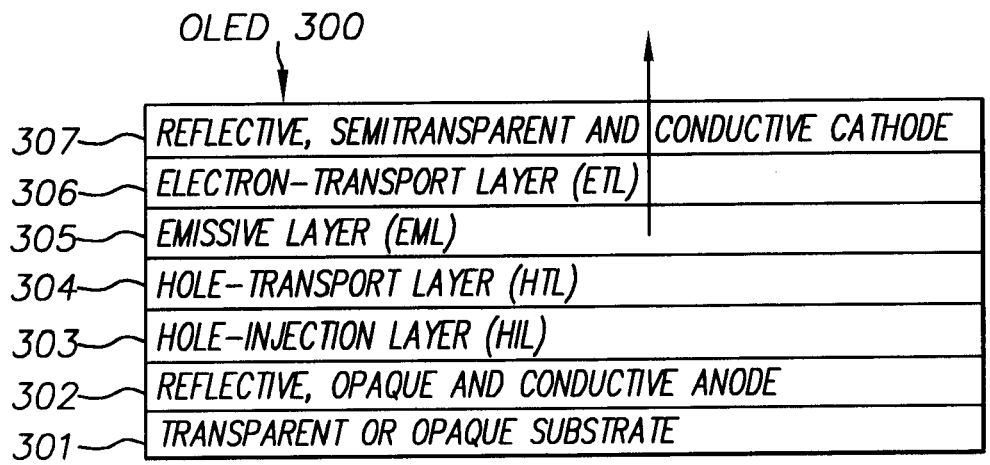
FIG. 3 shows schematically the layer structure of a top-emitting OLED of prior art.

Turning now to FIG. 3, the OLED 300 is a prior art top-emitting OLED, which includes a transparent or opaque substrate 301, a reflective, opaque and conductive anode 302, a low absorption hole-injection layer (HIL) 303, a hole-transport layer (HTL) 304, an emissive layer (EML) 305, an electron-transport layer (ETL) 306, and a reflective, semitransparent and conductive cathode 307. The cathode 307 includes a metal having a work function lower than about 4 eV. In operation, the anode 302 and the cathode 307 are connected to a voltage source and electrical current is passed through the organic layers, resulting in light generation in the emissive layer 305, and a part of the generated light is emitted through the cathode 307 in the direction shown by the arrow. The intensity of generated light is dependent on the magnitude of the electrical current passed through the OLED 300, which in turn is dependent on the luminescent and electrical characteristics of the organic layers as well as the charge-injecting natures of the anode 302, hole-injection layer 303, and cathode 307. The emission viewable is further dependent on the transmittance of the cathode 307 and reflectance of the anode 302 and the absorbance of the hole-injection layer 303 as well as the layer structure of the OLED 300.

Figure 4:
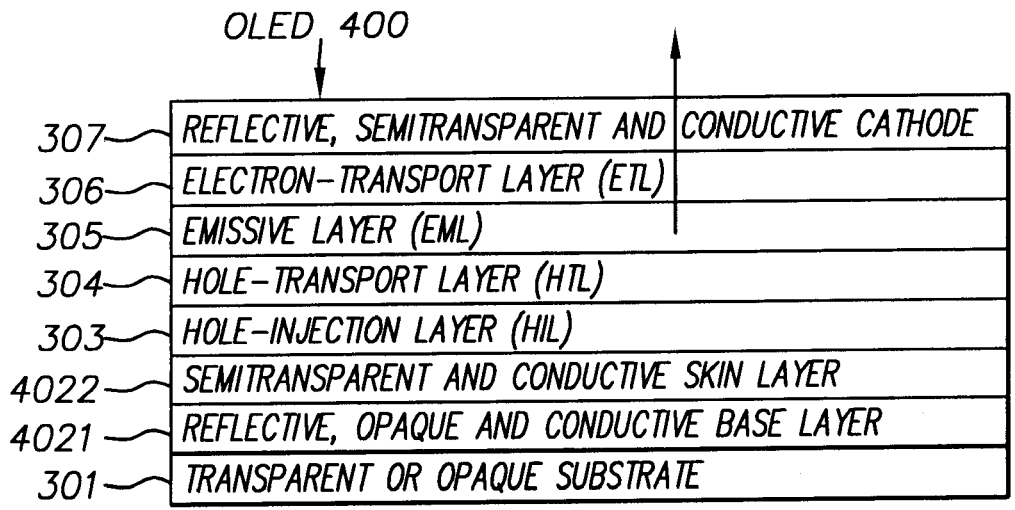
FIG. 4 shows schematically the layer structure of a top-emitting OLED of the present invention.

In FIG. 4 a top-emitting OLED 400 of the present invention is shown. The anode structure includes a base layer 4021 over which a thin layer 4022 is formed, otherwise the OLED 400 (FIG. 3) is identical to OLED 300 (FIG. 3). The base layer 4021 is conductive having highly reflective metals including but not limited to Ag, Au, Cu Al, Mg, Zn, Rh, Ru, or Ir or alloys thereof. The thickness of the layer is selected to have very low transmission. The thin layer 4022 includes an alloy of a base layer metal and is very thin, typically in the range of 1 to 20 nm, and hereafter termed as the skin layer 4022. The skin layer 4022 is semitransparent and conductive and its composition is different from the composition of the base layer. The alloying metals in the skin layer can include Ag, Au, Cu Al, Mg, Zn, Rh, Ru, Ir, Pd, Ni, Cr, Pt, Co, Te, or Mo or combinations thereof.

Figure 5:
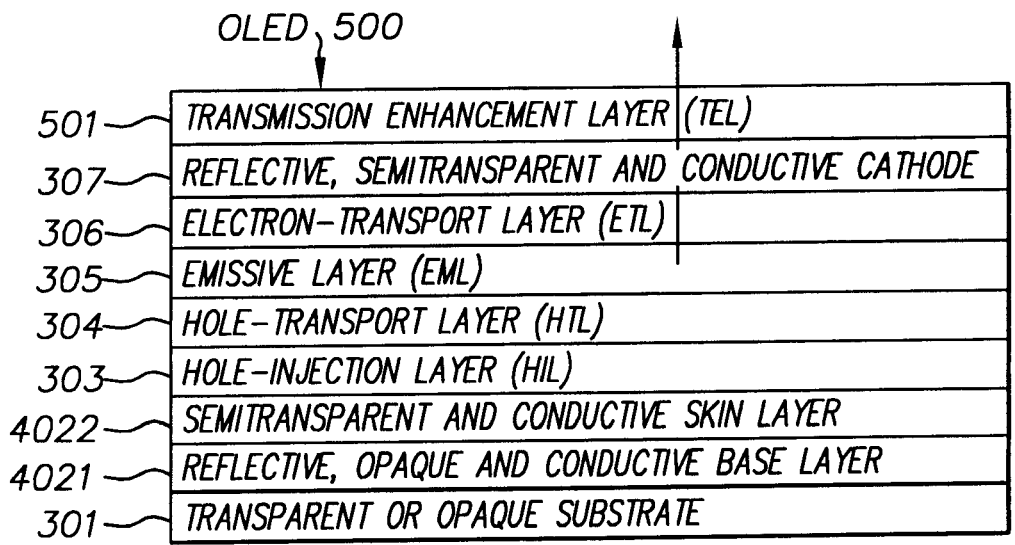
FIG. 5 shows schematically the layer structure of another embodiment of a top-emitting OLED of the present invention.

FIG. 5 is another top-emitting OLED of the present invention. In this embodiment, OLED 500, a transmission enhancement layer (TEL) 501 is deposited over the reflective, semitransparent and conductive cathode 307, otherwise the OLED 500 is identical to the OLED 400. In accordance with the present invention it was found that the bilayer anode structure including a base layer and a skin layer results in OLEDs that exhibit stable drive voltage. In contrast to prior art OLEDs including a single layer metallic anode, which in order to maintain drive current, requires monotonic increase in drive voltage throughout the operating life, the OLEDs of the present invention needs very little or no such adjustment in drive voltage.

In accordance with the present invention it was found that the aforementioned bilayer anode structure results in OLEDs that exhibit stable drive voltage. In contrast to prior art OLEDs that require monotonic increase of drive voltage throughout the operating period to maintain fixed drive current, the OLEDs of the present invention needs no or very little increase of drive voltage in prolong operation.

Figure 6:
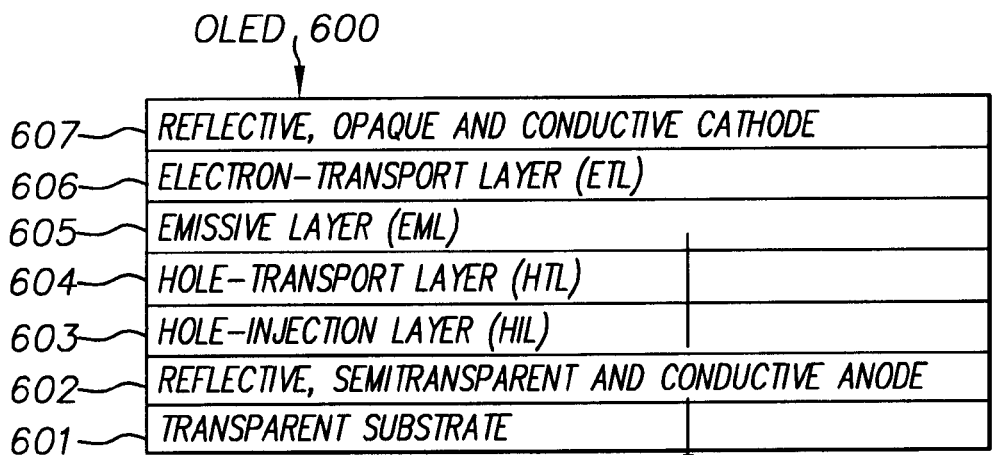
FIG. 6 shows schematically the layer structure of a bottom-emitting OLED of prior art.

Turning now to FIG. 6, the OLED 600 is a prior art bottom-emitting OLED, which includes a transparent 601, a reflective, semitransparent and conductive anode 602, a low absorption hole-injection layer (HIL) 603, a hole-transport layer (HTL) 604, an emissive layer (EML) 605, an electron-transport layer (ETL) 606, and a reflective, opaque and conductive cathode 607. The cathode 607 includes a metal having a work function lower than about 4 eV. In operation, the anode 602 and the cathode 607 are connected to a voltage source and electrical current is passed through the organic layers, resulting in light generation in the emissive layer 605, and a part of the generated light is emitted through the anode 602 and the substrate 601 in the direction shown by the arrow. The intensity of generated light is dependent on the magnitude of the electrical current passed through the OLED 600, which in turn is dependent on the luminescent and electrical characteristics of the organic layers as well as the charge-injecting natures of the anode 602, hole-injection layer 603, and cathode 607. The emission viewable is further dependent on the transmittance of the substrate 601, anode 602, hole-injection layer 603 and on the reflectance of the cathode 607 as well as the layer structure of the OLED 600.

Figure 7:
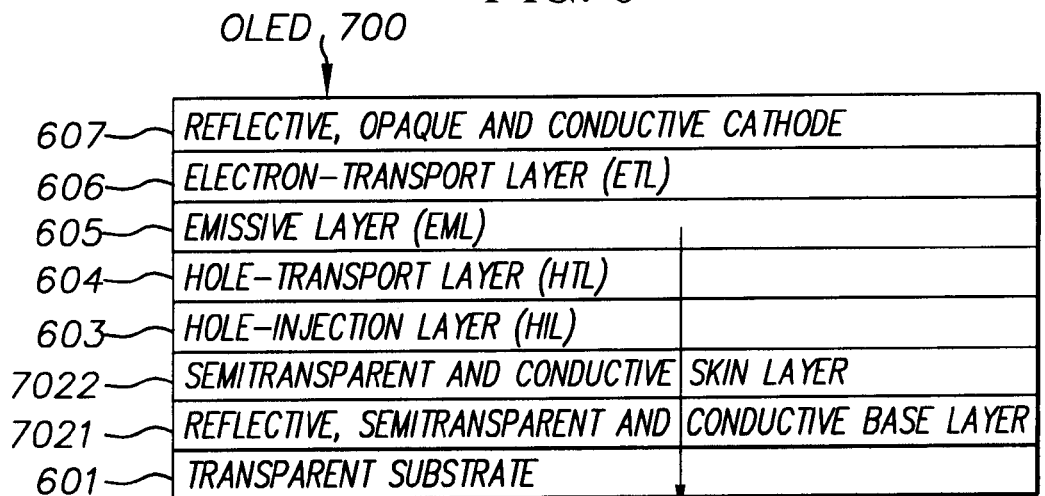
FIG. 7 shows schematically the layer structure of a bottom-emitting OLED of the present invention.

In FIG. 7 a bottom-emitting OLED 700 of the present invention is shown. The anode structure includes a base layer 7021 over which a thin layer 7022 is formed, otherwise the OLED 700 (FIG. 7) is identical to OLED 600 (FIG. 6). The base layer 7021 is conductive including highly reflective metals including but not limited to Ag, Au, Cu Al, Mg, Zn, Rh, Ru, or Ir or alloys thereof. The thickness of the base layer 7021 is selected such that the layer is semitransparent and weakly absorbing. By weakly absorbing it is meant that the absorption of a film on glass is 30% or less over visible wavelengths. The reflectivity of such layers can be about 30% or greater. Depending on the metals or alloys selected the thickness of the base layer 7021 (FIGS. 7 and 8) can be greater than about 4 nm but less than about 40 nm. The thin layer 7022 includes an alloy of a base layer metal and is very thin, typically in the range of 1 to 20 nm, and hereafter termed as the skin layer. The skin layer is semitransparent and conductive and selected such that the layer is also semitransparent and its composition is different from the composition of the base layer. The alloying metals in the skin layer can include Ag, Au, Cu Al, Mg, Zn, Rh, Ru, Ir, Pd, Ni, Cr, Pt, Co, Te, or Mo or combinations thereof.

Figure 8:
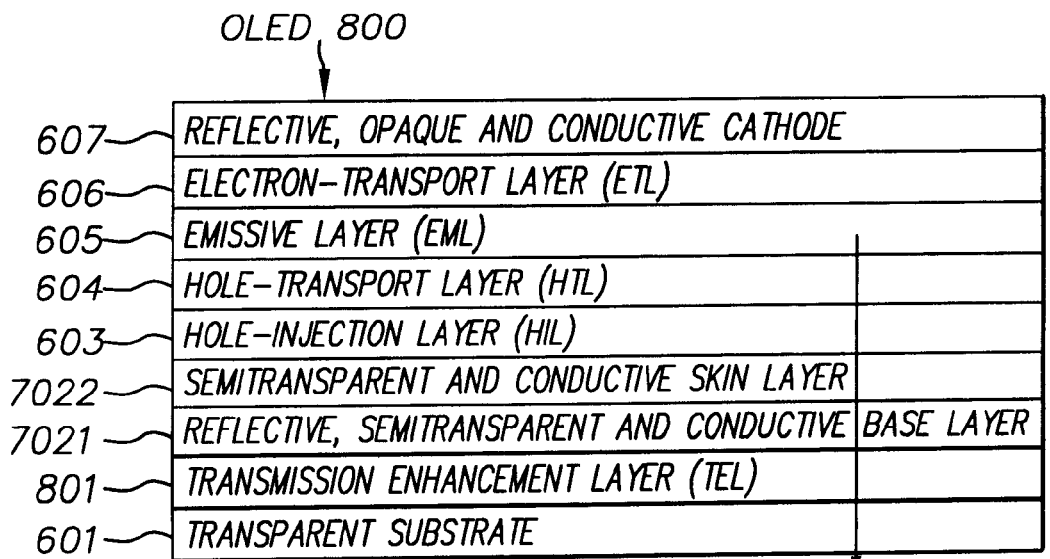
FIG. 8 shows schematically the layer structure of another embodiment of a bottom-emitting OLED of the present invention.
Figure 9:
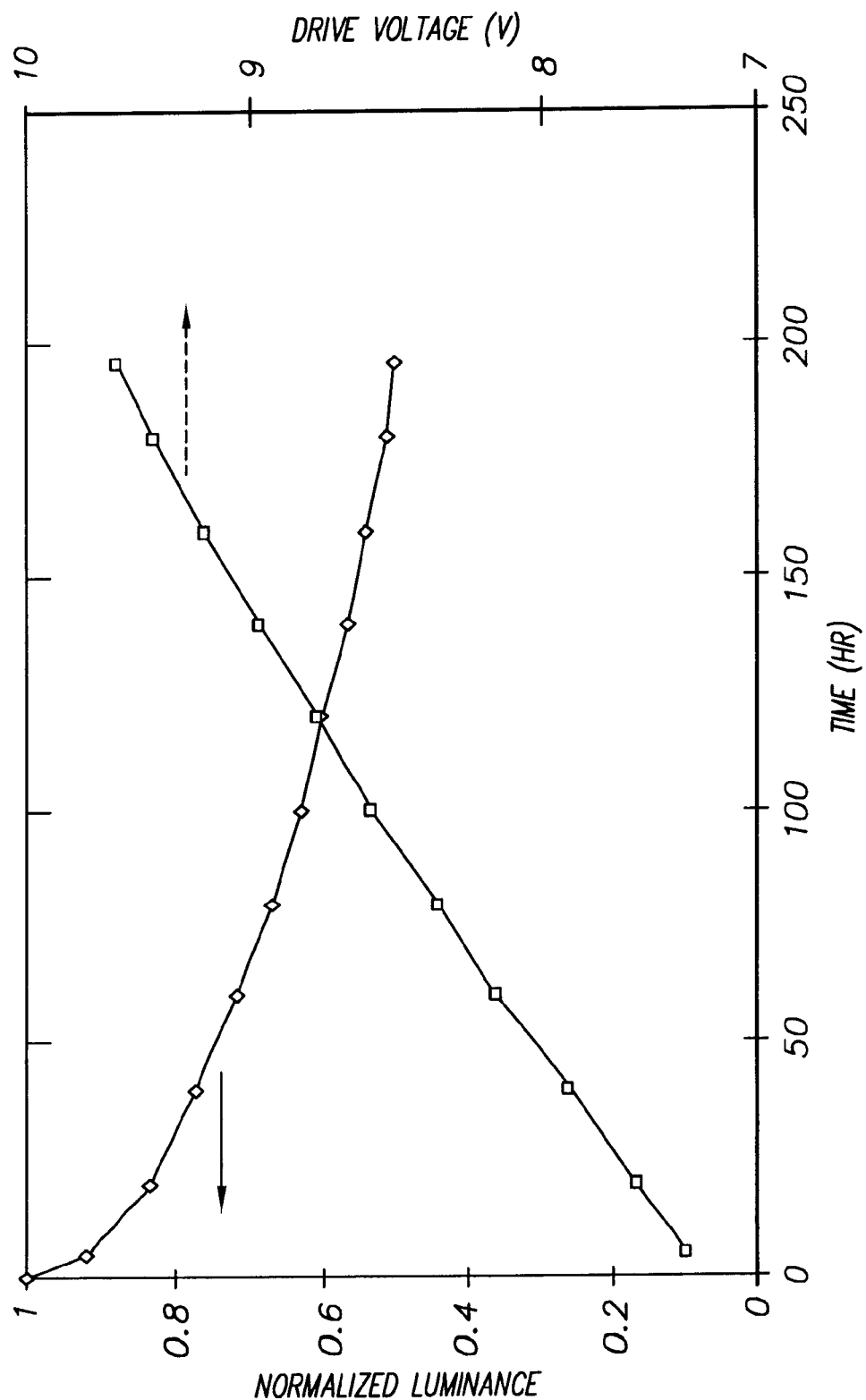
FIG. 9 shows the luminance and drive voltage of an OLED of a prior art OLED as a function testing time; the OLED is operated at constant current density of 80 mA/cm$^2$.
Figure 10:
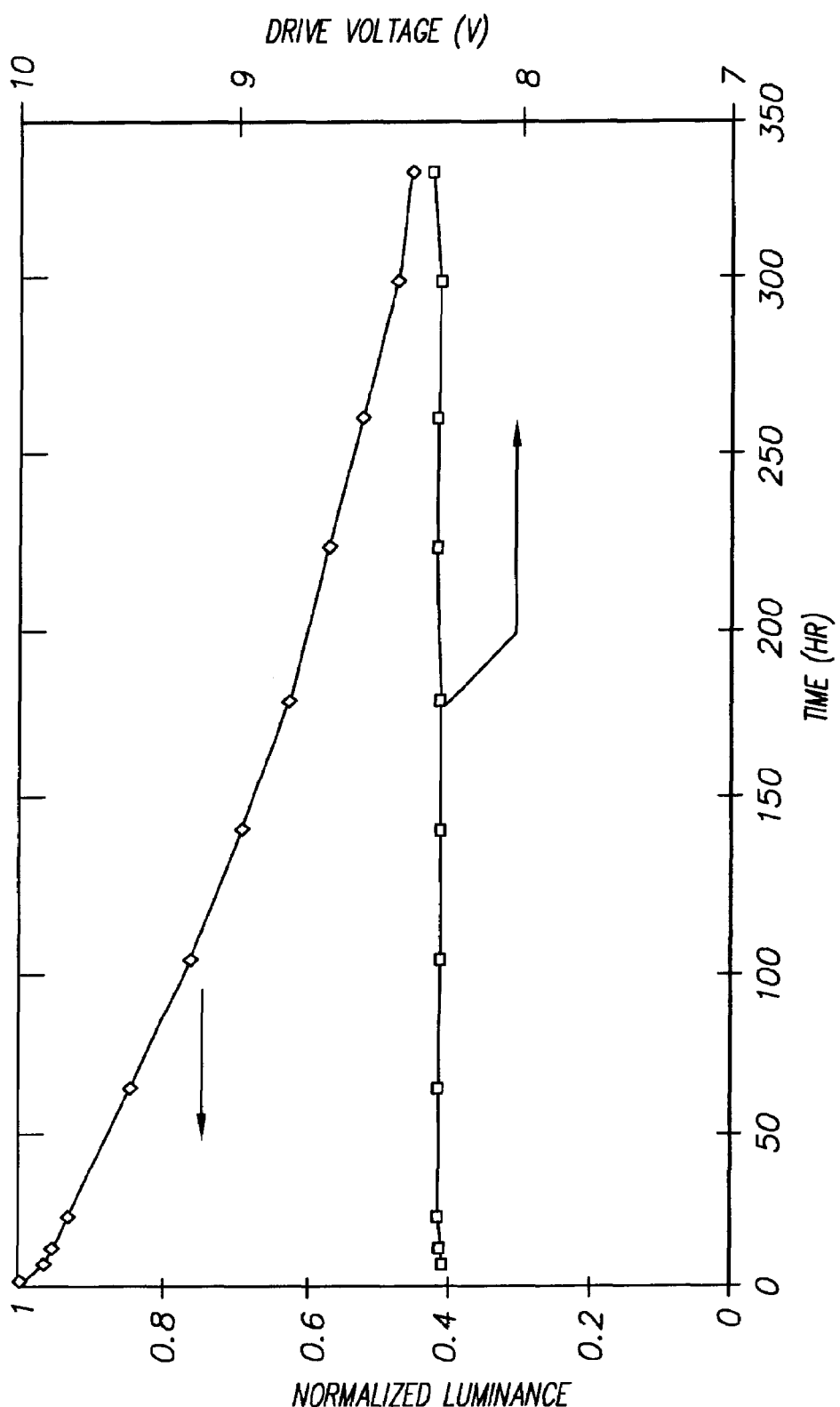
FIG. 10 shows the luminance and drive voltage of an OLED of the present invention as a function testing time; the OLED is operated at constant current density of 80 mA/cm$^2$.

FIG. 8 is another bottom-emitting OLED of the present invention. In this embodiment OLED 800 a transmission enhancement layer (TEL) 801 is deposited between the transparent substrate 601 and the reflective, semitransparent and conductive anode base layer 7021; otherwise the OLED 800 is identical to the OLED 700. In accordance with the present invention was found that the aforementioned anode structure results in OLEDs that exhibit stable drive voltage.

The composition and the function of the various layers constituting the OLED device are described as follows.

Substrate 301 (FIGS. 3–5) may include any substrate, opaque, semitransparent or transparent including glass, ceramic, metal, alloy, plastics or semiconductor as the light emits through the surface opposite to the substrate. The substrate 601 (FIGS. 6–8) should be as transparent as possible as in these cases light emits through substrate 601. The substrates 301 or 601 may take the form of rigid plate, flexible sheet, or curved surfaces. Since the OLED device fabrication does not require high temperature process, any material that can withstand process temperatures of the order of 100° C. is useful as substrates 301 or 601. Substrate 301 or 601 may include support with electronic backplane, and thus includes active-matrix substrates, which contain electronic addressing and switching elements. Active-matrix substrates can contain high temperature polysilicon thin-film-transistors, low temperature polysilicon thin-film-transistors or amorphous silicon thin film transistors. Those skilled in the art will appreciate that other circuit elements can be used to address and drive the OLED devices.

Anode 302 (FIGS. 3–5) or 602 (FIGS. 6–8) provide the function of injecting holes into the organic layer when a positive potential relative to the cathode 307 (FIGS. 3–5) or to the cathode 607 (FIGS. 6–8) is applied. The composition and the layer structure of the anodes have been described above. The anode layers can be fabricated by any deposition method including sputtering or evaporation and may also be compatible with the manufacturing process for OLEDs 300–800. These anodes 302 or 602 may or may not need an overlying hole-injecting layer 303 ((FIGS. 3–5) or 603 (FIGS. 6–8).

Hole-injection layer 303 (FIGS. 3–5) or 603 (FIGS. 6–8) provide the function of increasing the efficiency of the hole-injection from the anode 302 (FIGS. 3–5) or from the anode 602 (FIGS. 6–8). It has been shown in above-cited commonly assigned U.S. patent application Ser. Nos. 10/347,013 and 10/346,424 that a layer of plasma polymerized fluorinated carbon or a layer of oxide is found useful as a hole injection layer 303 or 603 for the metallic anode 302 or 602. The hole-injection layer 303 results in an OLEDs with reduced operating voltage, increased luminance efficiency and enhanced operational stability. The fluorinated carbon hole-injection layer includes $CF_x$, wherein x is less than or equal to 3 and greater than 0. The method of preparation and the characteristics of $CF_x$ have been disclosed in commonly assigned U.S. Pat. No. 6,208,077. The oxide hole-injecting layers can include oxides of Mo, V or Ru. A layer of these materials each about 30 nm thick on 120 nm thick ITO on glass and have been found useful in bottom-emitting non-microcavity OLEDs as a hole injector to TPD, an hole-transport layer ("Metal oxides as a hole-injecting layer for an organic electroluminescent device", S. Tokito, K. Noda and Y. Taga, J. Phys. D; Appl. Phys. 29, 2750 (1996)). The $MoO_3$ was prepared by sputtering. An ITO layer on Ag reflector has been used to enhance hole injection from the anode that would not presumably allow efficient hole injection to the HTL directly from the Ag (M.-H. Lu, M. S. Weaver, T. X. Zhou, M. Rothman, R. C. Kwong, M. Hack, and J. J. Brown, "High-efficiency top-emitting organic light-emitting devices", Appl. Phys. Lett. 81, 3921 (2002). A hole-injecting layer including CFx or an oxide provides efficient hole injection from many anodes yielding OLEDs with high efficiency. Even high workfunction metals that are believed efficient hole injectors were benefited from a hole-injecting layer. (P. K. Raychaudhuri, J. K. Madathil, Joel D. Shore, and Steven A. Van Slyke, "Performance Enhancement of Top- and Bottom-Emitting Organic Light-Emitting Devices Using Microcavity Structures" Proceeding of the The $23^{rd}$ International Display Research Conference, Phoenix, Ariz., USA, Sep. 15–19, 2003, p 10). The CFx is prepared by decomposition of $CHF_3$ gas in RF plasma. The $MoO_x$ layer is prepared by vacuum evaporation of $MoO_3$ and the deposited film can be non-stoichiometric having the composition represented by MoOx where in x is less than 3 but greater than 0. The HIL depending on the conductivity and transparency is usable up to several tens of nanometers. Other hole injectors for metallic anodes may include, IZO, $Pr_2O_3$, $TeO_2$, CuPc, or $SiO_2$.

Hole-transport layer 304 (FIGS. 3–5) or 604 (FIGS. 6–8) provides the function of transporting holes to the emissive layer 305 (FIGS. 3–5) or 605 (FIGS. 6–8) 105. Hole-transport materials include various classes of aromatic amines as disclosed in commonly assigned U.S. Pat. No. 4,720,432. A preferred class of hole-transport materials includes the tetraaryldiamines of formula (I).

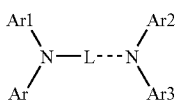

(I)

wherein:
Ar, Ar1, Ar2 and Ar3 are independently selected from among phenyl, biphenyl and naphthyl moieties;
L is a divalent naphthylene moiety or $d_n$;
d is a phenylene moiety;
n is an integer of from 1 to 4; and
at least one of Ar, Ar1, Ar2 and Ar3 is a naphthyl moiety.

Figure 1:
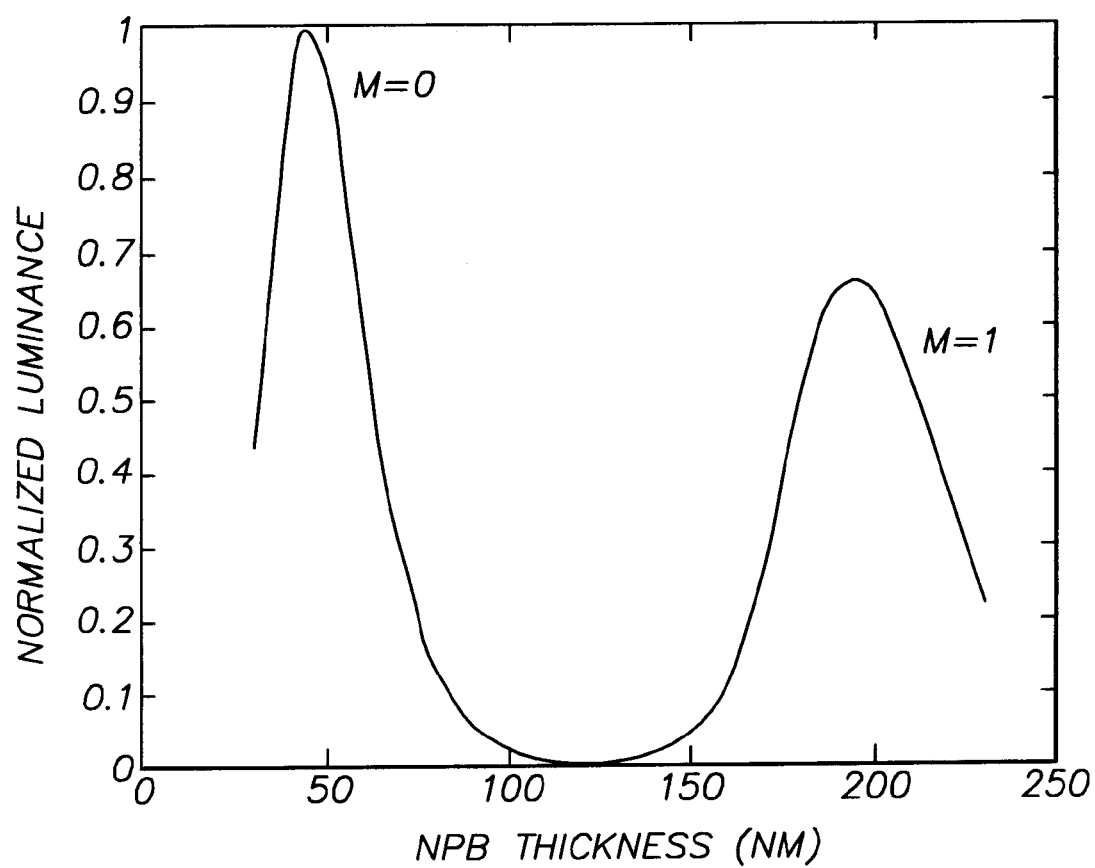
FIG. 1 shows the on-axis luminance determined by optical modeling of a top-emitting OLED as a function of the NPB HTL thickness in the following diode structure: Glass/80 nm Ag/NPB (variable)/60 nm Alq/14 nm MgAg.
Figure 2:
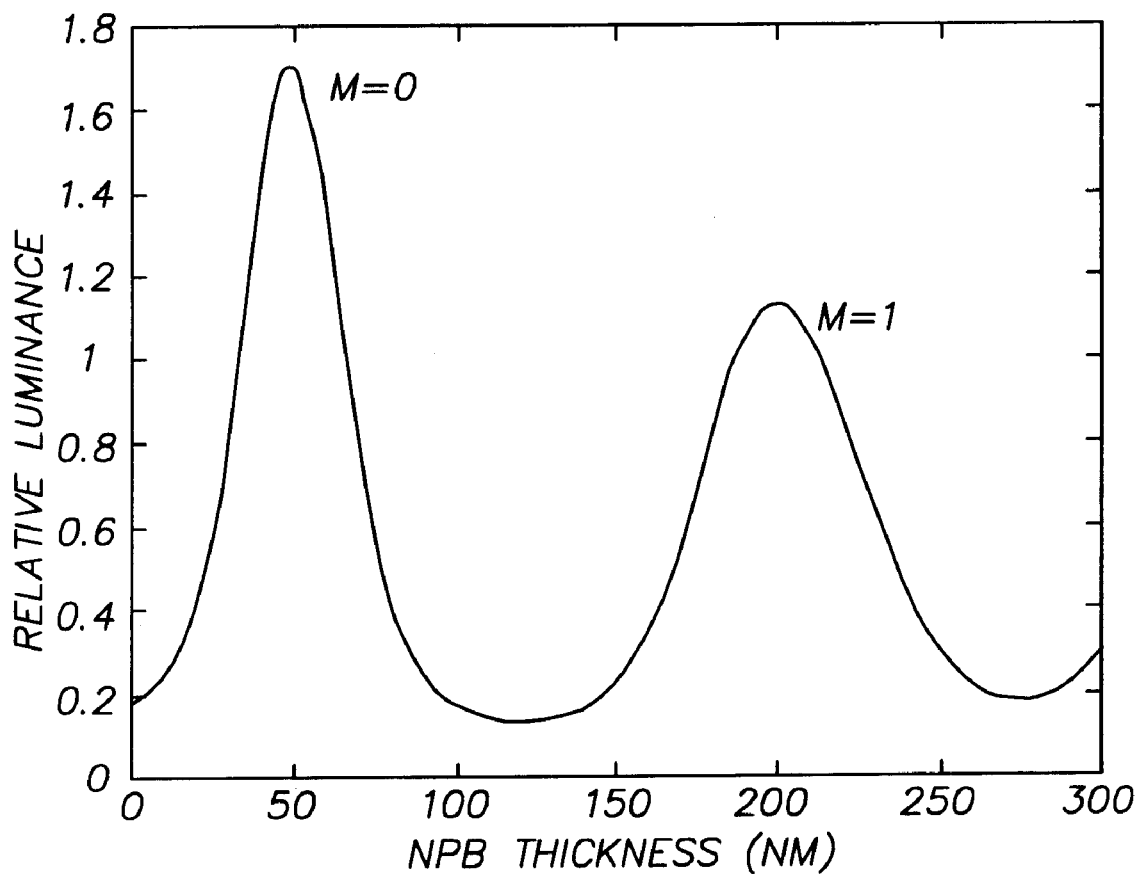
FIG. 2 shows the on-axis luminance determined by optical modeling of a bottom-emitting OLED as a function of the NPB HTL thickness in the following diode structure: Glass/20 nm Ag/NPB (variable)/60 nm Alq/200 nm MgAg.

Useful selected (fused aromatic ring containing) aromatic tertiary amines are the following:
4,4'-Bis[N-(1-naphthyl)-N-phenylamino]biphenyl (NPB)
4,4"-Bis[N-(1-naphthyl)-N-phenylamino]-p-terphenyl
4,4'-Bis[N-(2-naphthyl)-N-phenylamino]biphenyl
1,5-Bis[N-(1-naphthyl)-N-phenylamino]naphthalene
4,4'-Bis[N-(2-pyrenyl)-N-phenylamino]bi-phenyl
4,4'-Bis[N-(2-perylenyl)-N-phenylamino]biphenyl
2,6-Bis(di-p-tolylamino)naphthalene
2,6-Bis[di-(1-naphtyl)amino]naphthalene Thickness of the HTL is chosen to maximize the luminance and its selection is dependent on the optical stack comprising the device. The device of the present invention is microcavity OLED and therefore the optical path length between the two reflective electrodes (anode and cathode) are to be chosen according to the mode selected for the emission from microcavity structure described above and in reference to FIGS. 1 and 2.

Emissive layer 305 (FIGS. 3–5) or 605 (FIGS. 6–8) provides the the function of light emission produced as a result of recombination of holes and electrons in this layer. A preferred embodiment of the emissive layer includes a host material doped with one or more fluorescent dyes. Using this host-dopant composition, highly efficient OLED devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable detail for OLED devices using Alq as the host material. As set forth in the Tang et al. commonly assigned U.S. Pat. No. 4,769,292, the emissive layer can contain a green light-emitting doped material, a blue light-emitting doped material, or a red light-emitting doped material.

Preferred host materials include the class of 8-quinolinol metal chelate compounds with the chelating metals being Al, Mg, Li, Zn, for example. Another preferred class of host materials includes anthracene derivatives such as 9,10 dinaphthyl anthracene; 9,10 dianthryl anthracene; and alkyl substituted 9,10 dinaphthyl anthracene, as disclosed in Shi et al. commonly assigned U.S. Pat. No. 5,935,721.

Dopant materials include most fluorescent and phorphorescent dyes and pigments. Preferred dopant materials include coumarins such as coumarin 6, dicyanomethylenepyrans such as 4-dicyanomethylene-4H pyrans, as disclosed in Tang et al. commonly assigned U.S. Pat. No. 4,769,292 and in Chen et al. in commonly assigned U.S. Pat. No. 6,020,078.

Electron-transport layer 306 (FIGS. 3–5) or 606 (FIGS. 6–8) provides the function of delivering electrons injected from the cathode to emissive layer 305 (FIGS. 3–5) or 605 (FIGS. 6–8). Useful materials include Alq, benzazoles, as disclosed in commonly assigned Shi et al. commonly assigned U.S. Pat. No. 5,645,948.

The cathode is typically a conducting, semitransparent, reflective and weakly absorbing thin film capable of efficiently injecting electrons into the ETL 206. (FIGS. 2–4) and consists of materials including alloys having a work function selected to be about 4.0 eV or less. Mg and Li containing alloys are generally used because they have low work functions and make efficient electron-injecting contacts to Alq ETL. Other materials with work-functions of <4.0 eV such as Mn can also be used as the electron injectors. Cathode 307 (FIGS. 3–5) or 607 (FIGS. 6–8) is typically a reflective and conductive film capable of efficiently injecting electrons into the electron-transport layer 306 (FIGS. 3–5) or 606 (FIGS. 6–8) and includes metallic materials with work-functions less than 4.0 eV. Mg and Li containing alloys are generally used because they have low work functions and make efficient electron-injecting contacts to Alq electron-transport layer 306 (FIGS. 3–5) or 606 (FIGS. 6–8). Other low work function metallic materials can also be used. These include metal or metal alloys including alloys of Ag or Al or other high reflectivity metals with metals like Mg, alkali metals, alkali earth metals, or Mn. Alternately, an effectively transparent electron injecting layer can be formed over the ETL 306 or 606 by depositing an ultrathin layer of an alkali metal or alkali earth metal or combinations thereof, or by depositing a compound of an electron injecting dopant and an activator metal like Al, Mg etc. The surface allows the use of virtually any metal, metal alloy or other conductors regardless of work-function to yield cathode with desired and improved properties. The cathode 307 (FIGS. 3–5) is the top electrode through which light passes out of the top-emitting OLEDs 300–500. The cathode 307 is semitransparent and weakly absorbing. By weakly absorbing it is meant that the absorption of a film on glass is 30% or less over visible wavelengths. The reflectivity of such layers can be about 30% or greater. Depending on the metals or alloys selected the thickness of the cathode 307 (FIGS. 3–5) can be greater than about 4 nm but less than about 40 nm. Cathode 607 (FIGS. 6–8) is typically a highly reflective, opaque and conductive film. By highly reflective it is meant that the reflectance of a metallic layer on a glass substrate is at least 40%. The term opaque means the transmission of the film on glass is less than 10%. Depending on the metals the thickness of the layer should be greater than 50 nm. The cathode 607 is generally vapor deposited on ETL although it is possible to use a sputtering deposition process (P. K. Raychaudhuri, C. W. Tang, J. K. Madathil, "Fabrication of Lithium-based alloy cathodes for organic light-emitting diodes by D C Magnetron sputtering", SID 2001 International Symposium (June 5–7, San Jose, Calif.) Digest, paper 31.4; Vol. 32, pp. 526–529, 2001 and P. K. Raychaudhuri and J. K. Madathil, "Fabrication of Sputtered Cathodes for Organic Light-Emitting Diodes Using Transparent Buffer", Proceedings of the 7th Asian Symposium on Information Display (September 2–4, Singapore) Digest, paper 50; Vol. 32, pp. 55–58, 2002).

Transmission enhancement layer (TEL) 501 of the OLED 500 (FIG. 5) or the TEL 801 of the OLED 800 (FIG. 8) is a highly transmissive index matching film that provides the function of out coupling of light to enhance the viewing intensity. The TEL includes conductive or nonconductive, inorganic or organic materials including but not limited to: ITO, indium zinc oxide (IZO), tin oxide (TO), antimony-doped tin oxide (ATO), fluorine-doped tin oxide (FTO), indium oxide (IO), zinc oxide (ZO), cadmium stannate (CTO), cadmium oxide, phosphorus-doped TO, Al-doped ZO, MgO, $MoO_x$, $SiO_2$ $Al_2O_3$ $TiO_2$, $ZrO_2$, SiN, AlN, TiN, ZrN, SiC, $Al_4C_3$, Alq, or NPB or mixtures thereof Depending on the optical indices of the material the thickness of the TEL 501 or 801 can range from 20 nm to 150 nm. The TEL 501 is disposed over the cathode 307 of the OLED 500 (FIG. 5). The TEL 801 is disposed between the transparent substrate 601 and the reflective, semitransparent and conductive base layer 7021 of the OLED 800 (FIG. 8).

Most OLED devices are sensitive to moisture or oxygen or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation.

OLED devices of this invention can employ various well-known optical effects in order to enhance their properties if desired. This includes optimizing layer thicknesses to yield maximum light transmission, replacing reflective electrodes with light-absorbing electrodes to enhance contrast, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

EXAMPLES

A prior art OLED was fabricated on plane glass plates upon which was deposited a layer of pure Ag by sputtering in Ar containing atmosphere. On the Ag surface a layer of $CF_x$, about 1 nm thick, was disposed by decomposing $CHF_3$ gas in RF plasma. The substrate of the OLEDs of the present invention was also glass plates upon which a bilayer anode comprising a base layer and a skin layer was fabricated also by sputtering in Ar. A layer of predetermined thickness of a metal such as Ag was deposited thus forming a reflective and conductive base layer. On the base layer a thin layer of an alloy also of selected thickness was deposited. The alloy layer was fabricated by simultaneously sputtering from two targets—one of them includes the metal of the base layer such as Ag and the other target is comprised of an alloying metal such Mg. The bilayer anode was also similarly coated with a $CF_x$ layer. The substrates were then transferred to a vacuum coater operating at $\sim 1 \times 10^{-6}$ Torr, where the organic stack including NPB HTL, and Alq EML/ETL were deposited in sequence. Then a cathode layer of an alloy, MgAg, (5 v % Ag) was deposited through a square mask, which defined an active area of 0.1 $cm^2$ for the OLED. Finally, the diodes were hermetically encapsulated in a glove box filled with dry nitrogen. When energized the emitted light emerged through the semitransparent top cathode. The luminance of the diodes was determined using a Photo Research PR650 spectroradiometer as a function of current. The drive voltage and luminance given here are those obtained when a current corresponding to 20 $mA/cm^2$ was passed through the diodes and luminance being determined in the direction normal to the device surface.

The operational stability of the diodes was tested at a constant current of 80 mA/cm2 as outlined by Van Slyke et.al ("Organic electroluminescent devices with improved stability" S. A. VanSlyke, C. H. Chen, and C. W. Tang, Appl. Phys. Lett. 69, 2160 (1996). The drive voltage was continuously adjusted to keep the operational current fixed. From these data were determined two parameters characteristic of operational degradation of the diode. They were the half—the time required for the luminance to drop to half of its initial value—and the average (over the testing period) drive voltage increase rate (AVIR).

Example 1

A prior art top-emitting device, OLED 1A and a top-emitting device, OLED 1B of the present invention were made in the same run. The prior art device was fabricated on glass substrate having a pure Ag anode, 60 nm thick, whereas the OLED of the present invention is a bilayer anode. The bilayer anode included a 60 nm thick base layer of pure Ag and a 6 nm thick skin layer of Ag Mo alloy. The concentration of Mo in the skin layer is 20% by volume. Each of the substrates was provided with a common $CF_x$ HIL, NPB HTL, Alq EML/ETL and a semitransparent top cathode. The cathode is an alloy, MgAg, semitransparent and 14 nm thick. The concentration of Ag in the cathode layer is 10% by volume. The OLED structures were selected based on the opaque, fully reflective and single layer anode of pure Ag and optimized for maximization of top emission. The devices have the following layer structures:

OLED 1 A: Glass (1.1 mm)/Ag (60 nm)/$CF_x$ (1 nm)/NPB (45 nm)/Alq (60 nm)/MgAg (14 nm)

OLED 1 B: Glass (1.1 mm)/Ag (60 nm)/AgMo (6 nm)/ $CF_x$ (1 nm)/NPB (45 nm)/Alq (60 nm)/MgAg (14 nm)

The layer structure and performance of the diodes are presented in Table 2:

TABLE 2

| OLED | Anode | Drive voltage (V) | Efficiency (cd/A) | AVIR (mV/h) | Half-life (hr) |
|---|---|---|---|---|---|
| 1A | Ag | 6.0 | 4.9 | 12 | 196 |
| 1B | Ag/AgMo | 6.1 | 3.2 | 5 | 425 |

The prior art OLED 1A with Ag anode and the OLED IB of the present invention with bilayer anode exhibit comparable drive voltages. The efficiency of device 1B is lower than that of device 1A presumably due to its low anode reflectivity. The efficiency can be improved by adjusting the composition and/or thickness of the AgMo skin layer as well as by readjusting the microcavity structure. It can be seen that that the average voltage increase rate (AVIR) of OLED 1B is less than that of the prior art device by a factor of 2. The operational life of the OLED IB is more than twice that of the OLED 1A as suggested from their half-lives shown in Table 2.

Example 2

A prior art bottom-emitting device, OLED 2A, and a bottom-emitting device, OLED 2B of the present invention were made in the same coating run. The prior art OLED was fabricated on glass substrate having a pure Ag anode, semitransparent, and 20 nm thick, whereas the OLED of the present invention is a bilayer anode. The bilayer anode is also semitransparent and included a 15 nm thick base layer of pure Ag and a 6 nm thick skin layer of AgMo alloy. The concentration of Mo in the skin layer is 20% by volume. Each of the substrates was provided with a common $CF_x$ HIL, NPB HTL, Alq EML/ETL and a fully reflective top cathode. The cathode is an alloy, MgAg, opaque and 220 nm thick. The concentration of Ag in the cathode layer is 10% by volume. The OLED structures were selected based on the semitransparent, reflective and single layer anode of pure Ag and optimized for maximization of bottom emission. The devices have the following layer structures:

OLED 2 A: Glass (1.1 mm)/Ag (20 nm)/$CF_x$ (1 nm)/NPB (45 nm)/Alq (60 nm)/MgAg (220 nm)

OLED 2 B: Glass (1.1 mm)/Ag (15 nm)/AgMo (6 nm)/$CF_x$ (1 nm)/NPB (45 nm)/Alq (60 nm)/MgAg (220 nm)

The layer structure and performance of the diodes are presented in Table 3:

TABLE 3

| OLED | Anode | Drive voltage (V) | Efficiency (cd/A) | AVIR (mV/h) | Half-life (hr) |
|---|---|---|---|---|---|
| 2A | Ag | 5.8 | 5.4 | 11 | 256 |
| 2B | Ag/AgMo | 5.8 | 2.7 | 3 | 422 |

The prior art OLED 2A with Ag anode and the OLED 2B of the present invention with bilayer anode exhibit identical drive voltages. The efficiency of device 2B is lower than that of device 2A presumably due to its low anode transmittance. The efficiency of bottom-emitting devices is very sensitive to the transparency of the anode and the efficiency of OLED 2B can be improved by adjusting the thickness and composition of the AgMo skin layer as well as by readjusting the microcavity structure. It can be seen that that the average voltage increase rate (AVIR) of OLED 1B is less than that of the prior art device by a factor of about 4. The operational life of the OLED 2B is about 65% greater than the OLED 2A as suggested from their half-lives shown in Table 3.

Example 3

A prior art bottom-emitting device, OLED 3A, and a top-emitting device, OLED 3B of the present invention were made in the same coating run. The prior art OLED was fabricated on glass substrate having a pure Ag anode, semitransparent, and 20 nm thick, whereas the OLED of the present invention is a bilayer anode. The bilayer anode of the OLED of the present invention is opaque and included a 75 nm thick base layer of pure Ag and a 10 nm thick skin layer of AgMg alloy. The concentration of Mg in the skin layer is 50% by volume. Each of the substrates was provided with a common $MoO_x$ HIL, NPB HTL and an Alq EML/ETL. The cathode for the prior device, 3A, is a fully reflective LiF/Al layer, 100 nm thick. The cathode of the device 3B is an alloy, MgAg, semitransparent and 14 nm thick. The concentration of Ag in the cathode layer is 10% by volume. The devices have the following layer structures:

OLED 3 A: Glass (1.1 mm)/Ag (20 nm)/$MoO_x$ (2 nm)/NPB (200 nm)/Alq (60 nm)/LiF (0.5 nm)/Al (100 nm)

OLED 3 B: Glass (1.1 mm)/Ag (75 nm)/AgMg (10 nm)/$MoO_x$ (2 nm)/NPB (45 nm)/Alq (60 nm)/LiF (0.5 nm)/MgAg (14 nm)

The layer structure and performance of the diodes are presented in Table 4:

TABLE 4

| OLED | Anode (nm) | Drive voltage (V) | Efficiency (cd/A) | AVIR (mV/h) | Half-life (hr) |
|---|---|---|---|---|---|
| 2A | Ag 20 | 11.2 | 5.5 | 7.5 | 162 |
| 2B | Ag/AgMg (75/10) | 6.7 | 5.4 | 1.7 | 315 |

The prior art OLED 3A with the semitransparent Ag anode has high drive voltage because the NPB HTL that corresponds to the second resonance frequency (m=1) of the microcavity. It can be seen that that the average voltage increase rate (AVIR) of OLED 3B is less than that of the prior art device by a factor of about 4. The operational life of the OLED 3B is about twice that of the OLED 3A as suggested from their half-lives shown in Table 4.

Example 4

A prior art top-emitting device, OLED 4A and a top-emitting device, OLED 4B of the present invention were made in the same run. The prior art device was fabricated on glass substrate having a pure Ag anode, 80 nm thick, whereas the OLED of the present invention is a bilayer anode. The bilayer anode included a 80 nm thick base layer of pure Ag and a 5 nm thick skin layer of AgAl alloy. The concentration of Al in the skin layer is 50% by volume. Each of the substrates was provided with a common $MoO_x$ HIL, NPB HTL, Alq EML/ETL and a semitransparent top cathode. The cathode is an alloy of Mg and Ag, semitransparent and 15 nm thick, with an interfacial layer of 0.5 nm LiF between the ETL and the MgAg layer. The concentration of Ag in the cathode layer is 10% by volume. The OLED structures were selected based on the opaque, fully reflective and single layer anode of pure Ag and optimized for maximization of top emission. The devices have the following layer structures:

OLED 4 A: Glass (1.1 mm)/Ag (80 nm)/$MoO_x$ (2 nm)/NPB (45 nm)/Alq (60 nm)/LiF (0.5 nm)/MgAg (15 nm)

OLED 4 B: Glass (1.1 mm)/Ag (80 nm)/AgAl (5 nm)/$MoO_x$ (2 nm)/NPB (45 nm)/Alq (60 nm)/LiF (0.5 nm)/MgAg (15 nm)

The layer structure and performance of the diodes are presented in Table 5:

TABLE 5

| OLED | Anode | Drive voltage (V) | Efficiency (cd/A) | AVIR (mV/h) | Half-life (hr) |
|---|---|---|---|---|---|
| 4A | Ag | 7.3 | 5.4 | 1.7 | 335 |
| 4B | Ag/AgAl | 8.4 | 3.9 | 0.6 | 230 |

The OLED 4B of the present invention has higher drive voltage and shorter half-life compared to the prior art OLED 4A. This is contrary to findings in other examples. It is possible that the surface of the bilayer anode of OLED 4B comprising Al got oxidized in air during transfer from the sputtering to the evaporation chamber. However, the average voltage increase rate (AVIR) of OLED 4B is less than that of the prior art device by a factor of 3. The efficiency of device 4B is lower than that of device 4A presumably due to its low anode reflectivity arising from oxidation of the anode surface. The efficiency of OLED 4B can be improved by preventing the anode surface by preventing oxidation and/or by adjusting the skin layer composition, as well as by readjusting the microcavity structure.

Example 5

A prior art top-emitting device, OLED 5A, and a top-emitting device, OLED 5B of the present invention were made in the same coating run. The prior art OLED was fabricated on glass substrate having a pure Ag anode, opaque, and 80 nm thick, whereas the OLED of the present invention is a bilayer anode. The bilayer anode is also opaque and included a 80 nm thick base layer of pure Ag and a 5 nm thick skin layer of AgPd alloy. The concentration of Pd in the skin layer is 50% by volume. Each of the substrates was provided with a common $MoO_x$ HIL, NPB HTL, Alq EML/ETL and a semitransparent top cathode. The cathode is an alloy of Mg and Ag, semitransparent and 15 nm thick, with an interfacial layer of 0.5 nm LiF between the ETL and the MgAg layer. The concentration of Ag in the cathode layer is 10% by volume. The OLED structures were selected based on the opaque, fully reflective and single layer anode of pure Ag and optimized for maximization of top emission. The devices have the following layer structures:

The devices have the following layer structures:

OLED 5 A: Glass (1.1 mm)/Ag (80 nm)/$MoO_x$ (2 nm)/ NPB (50 nm)/Alq (60 nm)/LiF (0.5 nm)/MgAg (15 nm)

OLED 5 B: Glass (1.1 mm)/Ag (80 nm)/AgPd (5 nm)/ $MoO_x$ (2 nm)/NPB (50 nm)/Alq (60 nm)/LiF (0.5 nm)/MgAg (15 nm)

The layer structure and performance of the diodes are presented in Table 6:

TABLE 6

| OLED | Anode | Drive voltage (V) | Efficiency (cd/A) | AVIR (mV/h) | Half-life (hr) |
|------|-------|-------------------|-------------------|-------------|----------------|
| 5A   | Ag    | 7.1               | 4.5               | 2.2         | 276            |
| 5B   | Ag/AgPd | 7.4             | 2.6               | 1.6         | 350            |

The prior art OLED 5A with Ag anode and the OLED 5B of the present invention with bilayer anode exhibit almost identical drive voltages. The efficiency of device 5B is lower than that of device 5A presumably due to its low anode reflectance. The efficiency of top-emitting devices is sensitive to the reflectivity of the anode and the efficiency of OLED 5B can be improved by adjusting the thickness and composition of the AgPd skin layer, as well as by readjusting the microcavity structure. It can be seen that that the average voltage increase rate (AVIR) of OLED 5B is significantly less than that of the prior art device, OLED 5A. The operational life of the OLED 5B is about 25% greater than the OLED 5A as suggested from their half-lives shown in Table 6.

Example 6

A top-emitting device, OLED 6B of the present invention, and a device OLED 6C was made in the same coating run. The OLEDs were fabricated on glass substrate having a metallic anode. The bilayer anode of the OLED 6B of the present invention is opaque and included a 75 nm thick base layer of pure Ag and a 10 nm thick skin layer of a AgZn alloy. The concentration of Zn in the skin layer is 50% by volume. The skin layer of the bilayer anode of the OLED 6C is a layer of pure Zn, 10 nm thick. Each of the substrates was provided with a common $MoO_x$ HIL, NPB HTL, Alq EML/ ETL and a semitransparent top cathode. The cathode is an alloy of Mg and Ag, semitransparent and 15 nm thick, with an interfacial layer of 0.5 nm LiF between the ETL and the MgAg layer. The concentration of Ag in the cathode layer is 10% by volume. The OLED structure was selected based on an opaque, fully reflective and single layer anode of pure Ag and optimized for maximization of top emission. The devices have the following layer structure OLED 6 B: Glass (1.1 mm)/Ag (75 nm)/AgZn (10 nm)/ $MoO_x$ (2 nm)/NPB (45 nm)/Alq (60 nm)/LiF (0.5 nm)/MgAg (15 nm)

OLED 6 C: Glass (1.1 mm)/Ag (75 nm)/Zn (10 nm)/ $MoO_x$ (2 nm)/NPB (45 nm)/Alq (60 nm)/LiF (0.5 nm)/MgAg (15 nm)

The layer structure and performance of the diodes are presented in Table 7:

TABLE 7

| OLED | Anode | Drive voltage (V) | Efficiency (cd/A) | AVIR (mV/h) | Half-life (hr) |
|------|-------|-------------------|-------------------|-------------|----------------|
| 6B   | Ag/AgZn | 6.9             | 4.7               | 0.1         | 330            |
| 6C   | Ag/Zn | 7.2               | 2.1               | 1.9         | 360            |

The two OLEDs have almost identical voltages and comparable half-lives. But the OLED 6C having the pure Zn skin layer, 10 nm thick exhibits lower luminance than the OLED 6B of the present invention that has in the anode structure an alloy skin layer of identical thickness. But the alloy structure of OLED 6B is likely to be more reflective than that of the OLED 6C and hence the former device is more efficient. Both devices can benefit from precise and individual tuning of the microcavity structure. It is believed that when properly tuned the OLED6B will be more efficient because the skin layer has the high reflectivity component of the base layer metal. One of the remarkable features of the OLED 6B is its stability of the drive voltage. Even when the luminance of the device degraded to 50% of the initial value, the drive voltage did not increase even by one tenth of a volt as suggested from the data given in Table 7.

It is seen from all the examples presented in Tables 2 through 7 that a microcavity OLED, top or bottom emitting, can benefit from a bilayer anode having a base layer including highly reflective metal and an overlying thin skin layer of an alloy. The alloy includes the highly reflective base layer metal and one or more other metals that help stabilize the contact. By selecting these layers and their thickness in the anode structure and by precise tuning of the microcavity structure high efficiency devices with exceptionally stable drive voltage can be fabricated.

The invention has been described in detail with particular reference to certain preferred embodiments thereof, but it will be understood that variations and modifications can be effected within the spirit and scope of the invention

| PARTS LIST | |
|---|---|
| 300 | Top-emitting organic light-emitting diode |
| 301 | Transparent or opaque substrate |
| 302 | Reflective, opaque and conductive anode |
| 303 | Hole-injection layer |
| 304 | Hole-transport layer |
| 305 | Emissive Layer |
| 306 | Electron-transport layer |
| 307 | Reflective, semitransparent and conductive cathode |
| 400 | Top-emitting organic light-emitting diode |
| 4021 | Reflective, opaque and conductive base layer |
| 4022 | Semitransparent and conductive skin layer |
| 500 | Top-emitting organic light-emitting diode |
| 501 | Transmission enhancement layer |
| 600 | Bottom-emitting organic light-emitting diode |
| 601 | Transparent substrate |
| 602 | Reflective, semitransparent and conductive anode |
| 603 | Hole-injection layer |
| 604 | Hole-transport layer |

-continued

PARTS LIST

| | |
|---|---|
| 605 | Emissive Layer |
| 606 | Electron-transport layer |
| 607 | Reflective, opaque and conductive cathode |
| 700 | Bottom-emitting organic light-emitting diode |
| 7021 | Reflective, semitransparent and conductive base layer |
| 7022 | Semitransparent and conductive skin layer |
| 800 | Bottom-emitting organic light-emitting diode |
| 801 | Transmission enhancement layer |

The invention claimed is:

1. In an OLED device, the improvement comprising:
    (a) a reflective and conductive bilayer anode including a metal or metal alloy or both;
    (b) a hole-injecting structure over the reflective and conductive bilayer anode;
    (c) at least one organic layer formed over the hole-injecting structure;
    (d) the reflective and conductive bilayer anode being configured to improve the stability of drive voltage; and
    (e) wherein the reflective and conductive bilayer anode includes a base layer of a highly reflective metal and a thin surface layer including an alloy of the base layer or an alloy of a different highly reflective metal in contact with the hole-injecting structure, and the metals alloyed with the highly reflective metals in the thin surface layer are Ag, Au, Cu, Al, Mg, Zn, Rh, Ru, Ir, Pd, Ni, Cr, Pt, Co, Te, or Mo or combinations thereof.

2. The OLED device of claim 1 wherein the at least one organic layer includes an emissive layer and an electron transport layer.

3. The OLED device of claim 1 further including a reflective and conductive cathode and wherein the reflectance and the transmittance of the reflective and conductive bilayer anode, and the thickness of the at least one organic layer and the cathode are selected to change the internal reflection of light to thereby improve emission.

4. The OLED device of claim 3 further including an electron transport layer and the reflective and conductive cathode including a metal or metal alloy or both provided over the electron transport layer.

5. The OLED device of claim 1 wherein the highly reflective metal is Ag, Au, Cu, Al, Mg, Zn, Rh, Ru, or Ir or combinations thereof.

6. The OLED device of claim 1 wherein the hole-injecting structure includes one or more hole-injection layers.

7. The OLED device of claim 1 wherein the hole injection structure includes $CF_x$, ITO, IZO, $Pr_2O_3$, $TeO_2$, CuPc, $SiO_2$, $VO_x$, $MoO_x$, or mixtures thereof.

8. The OLED device of claim 3 wherein the reflective and conductive cathode includes metal or metal alloys having a work function selected to be about 4.0 eV or less.

9. The OLED device of claim 8 wherein the metal or metal alloys include alloys of Ag or Al with Mg, alkali metals, alkali earth metals, or Mn.

10. The OLED device of claim 1 wherein the device emits light through the reflective and conductive bilayer anode.

11. The OLED device of claim 3 further including a transmissive cathode and wherein the device emits light through the transmissive cathode.

12. The OLED device of claim 1 wherein the reflective and conducting bilayer anode is semitransparent.

13. The OLED device of claim 3 wherein the reflective and conductive cathode is opaque.

14. The OLED device of claim 12 further includes a transparent substrate having a transmission enhancement layer between the transparent substrate and the reflective conductive and semitransparent bilayer anode.

15. The OLED device of claim 11 further includes a transmission enhancement layer over the transmissive cathode.

16. The OLED device of claim 14 wherein the transmission enhancement layer includes ITO, MgO, $MoO_x$, $SnO_2$, $TiO_2$, $Al_2O_3$, $SiO_2$, ZnO, $ZrO_2$, Alq, NPB, SiN, AlN, TiN, SiC, $Al_4C_3$, or mixtures thereof.

17. The OLED device of claim 15 wherein the transmission enhancement layer includes ITO, MgO, $MoO_x$, $SnO_2$, $TiO_2$, $Al_2O_3$, $SiO_2$, ZnO, $ZrO_2$, Alq, NPB, SiN, AlN, TiN, SiC, $Al_4C_3$, or mixtures thereof.

18. The OLED device claim 14 wherein the thickness of the transmission enhancement layer is a range from 20 nm to 150 nm.

19. The OLED device claim 15 wherein the thickness of the transmission enhancement layer is a range from 20 nm to 150 nm.

20. In an OLED device, the improvement comprising:
    (a) a reflective and conductive bilayer anode including a metal or metal alloy or both;
    (b) a hole-injecting structure over the reflective and conductive bilayer anode;
    (c) at least one organic layer formed over the hole-injecting structure;
    (d) the reflective and conductive bilayer anode being configured to improve the stability of drive voltage; and
    (e) a reflective and conductive opaque cathode and wherein the reflectance and the transmittance of the reflective and conductive bilayer anode, and the thickness of the at least one organic layer and the cathode are selected to change the internal reflection of light to thereby improve emission.

21. In an OLED device, the improvement comprising:
    (a) a reflective and conductive bilayer semi-transparent anode including a metal or metal alloy or both;
    (b) a hole-injecting structure over the reflective and conductive bilayer anode;
    (c) at least one organic layer formed over the hole-injecting structure;
    (d) the reflective and conductive bilayer anode being configured to improve the stability of drive voltage; and
    (e) a transparent substrate having a transmission enhancement layer between the transparent substrate and the reflective conductive and semitransparent bilayer anode and wherein the transmission enhancement layer includes ITO, MgO, $MoO_x$, $SnO_2$, $TiO_2$, $Al_2O_3$, $SiO_2$, ZnO, $ZrO_2$, Alq, NPB, SiN, AlN, TiN, SiC, $Al_4C_3$, or mixtures thereof.

* * * * *

UNITED STATES PATENT AND TRADEMARK OFFICE
CERTIFICATE OF CORRECTION

PATENT NO. : 7,157,156 B2 Page 1 of 1
APPLICATION NO. : 10/804960
DATED : January 2, 2007
INVENTOR(S) : Pranab K. Raychaudhuri et al.

It is certified that error appears in the above-identified patent and that said Letters Patent is hereby corrected as shown below:

Column 18, line 58    "AIN" should read --A1N--

Signed and Sealed this

Sixteenth Day of October, 2007

JON W. DUDAS
*Director of the United States Patent and Trademark Office*